(12) United States Patent
Yeh et al.

(10) Patent No.: US 10,991,656 B2
(45) Date of Patent: Apr. 27, 2021

(54) SEMICONDUCTOR DEVICE PACKAGE

(71) Applicant: Advanced Semiconductor Engineering, Inc., Kaohsiung (TW)

(72) Inventors: Chang-Lin Yeh, Kaohsiung (TW); Jen-Chieh Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/446,368

(22) Filed: Jun. 19, 2019

(65) Prior Publication Data
US 2020/0402911 A1    Dec. 24, 2020

(51) Int. Cl.
*H01L 23/48* (2006.01)
*H01L 23/538* (2006.01)
*H01L 25/16* (2006.01)
*H01L 23/498* (2006.01)
*H01L 23/00* (2006.01)
*H01L 23/31* (2006.01)

(52) U.S. Cl.
CPC ...... *H01L 23/5385* (2013.01); *H01L 23/3128* (2013.01); *H01L 23/49816* (2013.01); *H01L 24/16* (2013.01); *H01L 25/165* (2013.01); *H01L 2224/16227* (2013.01); *H01L 2924/19105* (2013.01)

(58) Field of Classification Search
CPC .................................................. H01L 2924/014
See application file for complete search history.

(56) References Cited

U.S. PATENT DOCUMENTS

| | | | | |
|---|---|---|---|---|
| 8,766,423 | B2* | 7/2014 | Yamaguchi | H01L 23/481 257/686 |
| 9,376,541 | B2* | 6/2016 | Kang | C08K 3/08 |
| 2003/0170450 | A1* | 9/2003 | Stewart | H05K 3/305 428/343 |
| 2008/0006843 | A1* | 1/2008 | Dai | H01L 25/167 257/99 |
| 2009/0008765 | A1* | 1/2009 | Yamano | H01L 23/3114 257/690 |
| 2009/0206492 | A1* | 8/2009 | Yamaguchi | H01L 23/5387 257/777 |
| 2011/0174527 | A1* | 7/2011 | Nagamatsu | H01L 24/12 174/261 |
| 2013/0187246 | A1* | 7/2013 | Adkisson | H01L 23/481 257/416 |
| 2016/0316559 | A1* | 10/2016 | Jung | H01L 24/13 |
| 2019/0393198 | A1* | 12/2019 | Takeya | H01L 25/0753 |

FOREIGN PATENT DOCUMENTS

TW     I281716 B     5/2007

* cited by examiner

*Primary Examiner* — Thao P Le
(74) *Attorney, Agent, or Firm* — Foley & Lardner LLP

(57) ABSTRACT

A semiconductor device package includes a first substrate, a second substrate disposed over the first substrate, and a surface mount device (SMD) component disposed between the first substrate and the second substrate. The SMD component includes a plurality of connection electrodes electrically connecting the first substrate to the second substrate, and the plurality of connection electrodes are electrically disconnected from each other.

25 Claims, 10 Drawing Sheets

SEMICONDUCTOR DEVICE PACKAGE

BACKGROUND

1. Technical Field

The present disclosure relates to a semiconductor device package, and to a semiconductor device package including one or more surface mount device (SMD) components configured as standoff components between two substrates and configured as interconnection components electrically connecting the substrates.

2. Description of the Related Art

A stacked semiconductor device package such as package on package (POP) or package in package (PIP) may include two substrates stacked to each other, and electronic components such as ICs may be disposed on the substrates. An encapsulation layer such as molding material is disposed between the substrates to encapsulate the electronic components, and silicon interposers are disposed between the substrates to electrically connect the electronic components disposed on the substrates. The silicon interposer, however, would impede the mold flow of the molding material, thus the yield and reliability of the semiconductor device package is deteriorated.

SUMMARY

In some embodiments, a semiconductor device package includes a first substrate, a second substrate disposed over the first substrate, and a surface mount device (SMD) component disposed between the first substrate and the second substrate. The SMD component includes a plurality of connection electrodes electrically connecting the first substrate to the second substrate, and the plurality of connection electrodes are electrically disconnected from each other.

In some embodiments, a semiconductor device package includes a first substrate, a second substrate disposed over the first substrate, a first conductive pad disposed on the first substrate, a second conductive pad disposed on the second substrate, and a surface mount device (SMD) component disposed between the first substrate and the second substrate. The SMD component includes at least one connection electrode electrically connecting the first conductive pad to the second conductive pad. An outer edge of the first conductive pad protrudes out a respective outer edge of the connection electrode, and an outer edge of the second conductive pad is substantially aligned with or recessed from the respective outer edge of the connection electrode.

In some embodiments, a semiconductor device package includes a first substrate, a second substrate disposed over the first substrate, a first conductive pad disposed on the first substrate, a second conductive pad disposed on the second substrate, and a surface mount device (SMD) component disposed between the first substrate and the second substrate and electrically connecting the first conductive pad to the second conductive pad. The SMD component includes an insulating base and at least one connection electrode. The insulating base includes a first outer surface facing the first substrate, a second outer surface facing the second substrate, and an outer edge connected to the first outer surface and the second outer surface. The connection electrode is disposed on the insulating base. The connection electrode includes a main portion disposed on the outer edge of the insulating base, a first extension portion extending to the first outer surface of the insulating base, and a second extension portion extending to the second outer surface of the insulating base. A length of the first extension portion of the connection electrode is different from a length of the second extension portion of the connection electrode.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
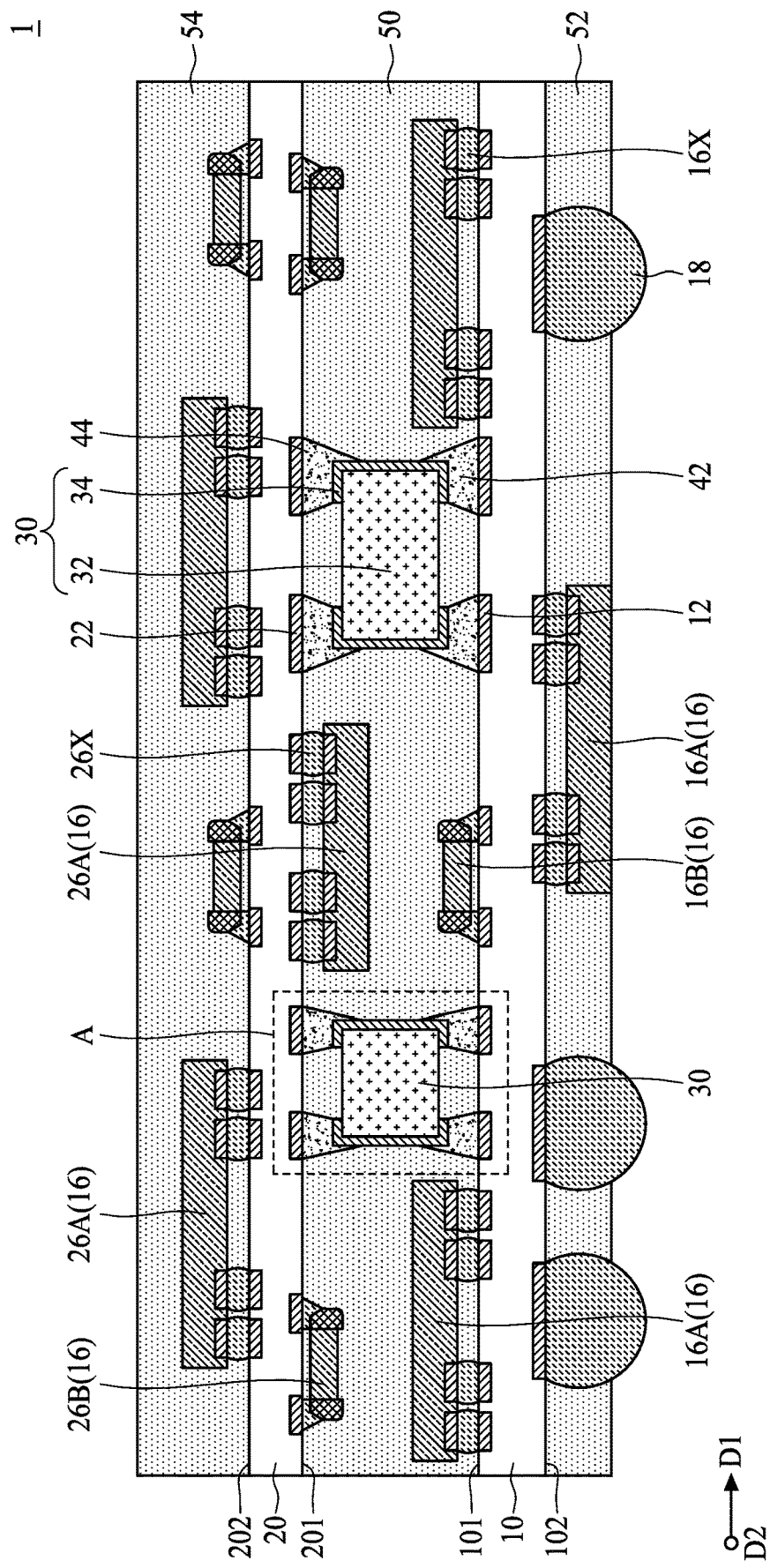
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The present disclosure provides for a semiconductor device package and a method for manufacturing the same. The semiconductor device package includes two stacked substrates, and a surface mount device (SMD) component disposed therebetween. The SMD component is configured as a standoff component for maintain a gap between the two stacked substrates, and also configured as an interconnection component for electrically connecting the two stacked substrates and electronic components disposed on the two stacked substrates. The SMD component may include a plurality of connection electrodes electrically connecting one of the substrates to the other. Each of the connection electrodes may electrically connects a respective electrical terminal of a first substrate to a respective electrical terminal of a second substrate in a vertical direction, and the connection electrodes are electrically disconnected from each other in a horizontal direction. The SMD component may include a plurality of discrete components separately arranged, which does not impede mold flow of molding compound. The SMD component may include a dummy passive component in which the passive component function is disabled.

Figure 1A:
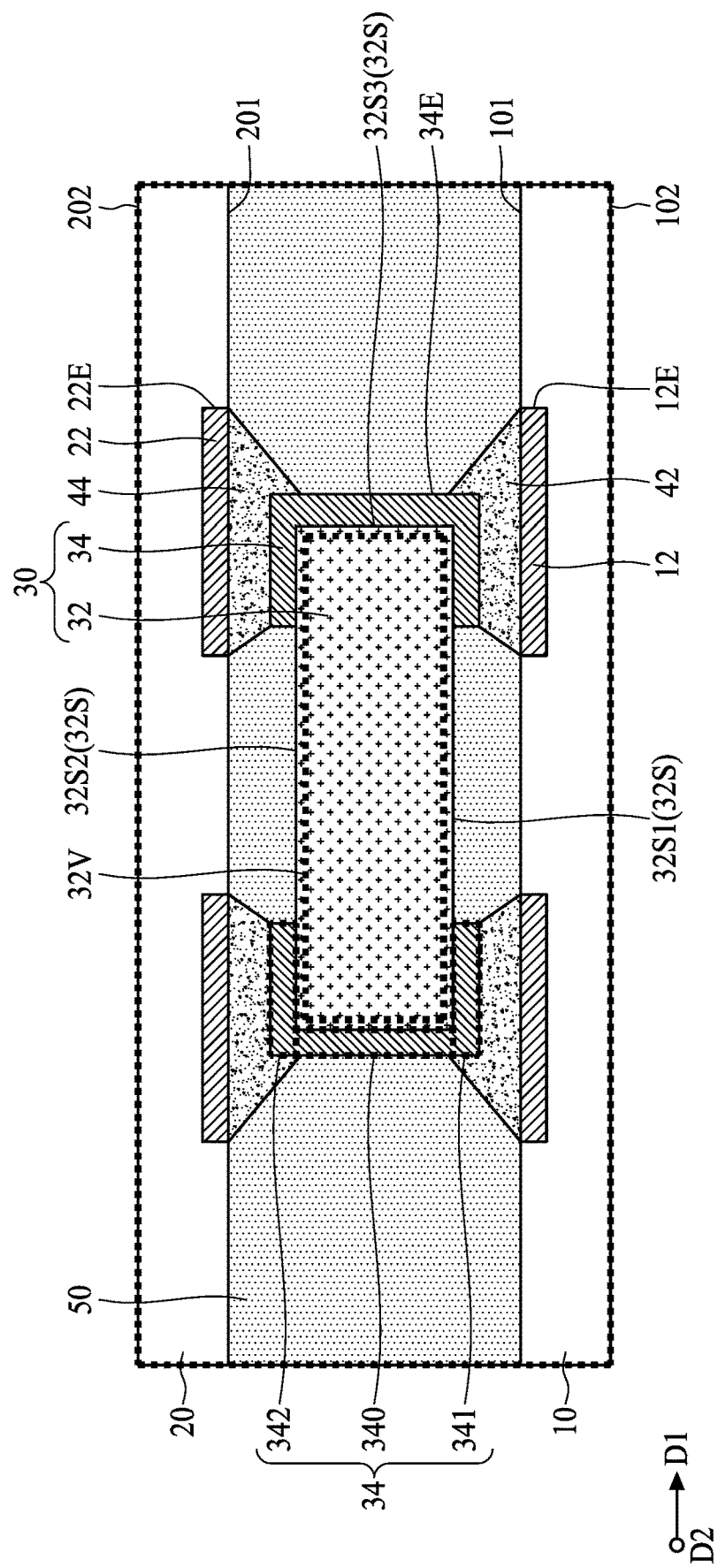
FIG. 1A is an enlarged cross-sectional view of area A of a semiconductor device package of FIG. 1.
Figure 1B:
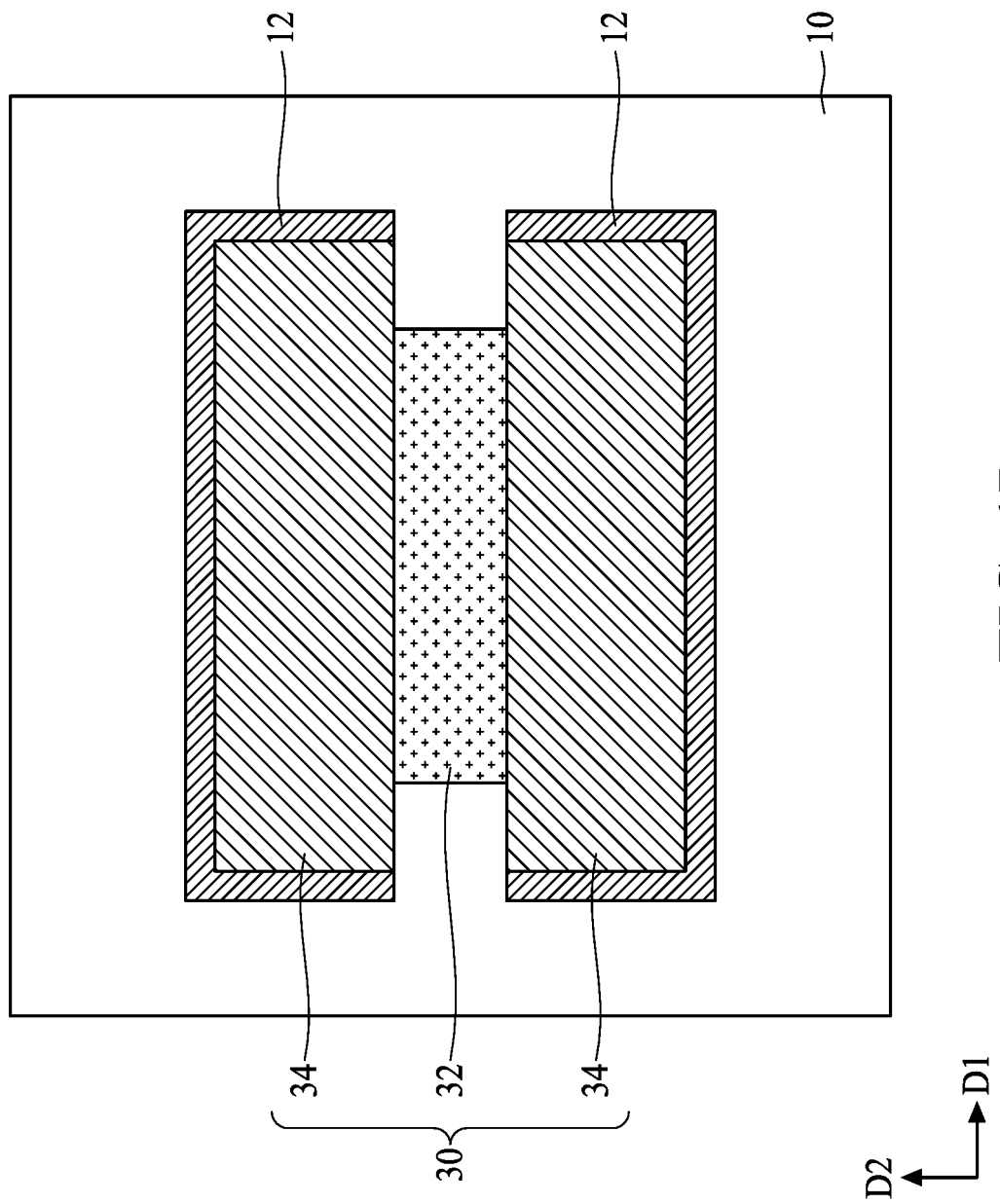
FIG. 1B is an enlarged top view of area A of a semiconductor device package of FIG. 1.

FIG. 1 is a cross-sectional view of a semiconductor device package 1 in accordance with some embodiments of the present disclosure, FIG. 1A is an enlarged cross-sectional view of area A of a semiconductor device package 1 of FIG. 1, and FIG. 1B is an enlarged top view of area A of a semiconductor device package 1 of FIG. 1. It is contemplated that some components are omitted in FIG. 1B for highlighting the features of the semiconductor device package 1. As shown in FIG. 1, FIG. 1A and FIG. 1B, the semiconductor device package 1 includes a first substrate 10, a second substrate 20, and at least one surface mount device (SMD) component 30. The second substrate 20 is disposed over the first substrate 10 and apart from the first substrate 10. The first substrate 10 includes a first surface 101, and the second substrate 20 includes a second surface 201 facing and apart from the first surface 101 of the first substrate 10. The first substrate 10 may include a package substrate such as a circuit board. By way of example, the first substrate 10 may include one or more dielectric layers, and one or more circuit layers stacked to each other. The material of the dielectric layer may include, but is not limited to, resin such as epoxy, bismaleimide triazine (BT) or the like, glass fiber such as FR-4 or the like, semiconductor, ceramic, glass, plastic or other suitable materials. The circuit layer(s) may include redistribution layer (RDL), through vias, conductive traces, conductive wires or the like. The circuit layer(s) may be disposed in the dielectric layer (s), on the dielectric layer(s) or between adjacent dielectric layer(s). The material of the circuit layer(s) may include, but is not limited to, metal such as copper (Cu) or the like. In some embodiments, the circuit layer in the first substrate 10 may include a substrate-level circuit layer, which is a low-density circuit layer with wider line width/line space (L/S). For example, the L/S of the circuit layer may be equal to or greater than about 10 μm/about 10 μm. In some other embodiments, the circuit layer in the first substrate 10 may include a substrate-level circuit layer may include a bumping-substrate, which is a high-density circuit layer with narrower L/S. For example, the L/S of the circuit layer may be less than about 10 μm/about 10 μm.

In some embodiments, the first substrate 10 may further include a plurality of first conductive pads 12 disposed on the dielectric layer(s). The first conductive pad 12 may be disposed in proximity to, adjacent to or embedded in and exposed by the dielectric layer, and configured to receive electronic components 16 and/or the SMD component 30. The first conductive pad 12 may be electrically connected to the circuit layer(s) of the first substrate 10. The material of the first conductive pad 12 may include, but is not limited to, for example metal such as copper (Cu) or the like. In some embodiments, the first conductive pad 12 may include UBM (under bump metallurgy). In some embodiments, passivation layer(s) may be disposed on the first substrate 10, and the passivation layer(s) my at least partially expose the first conductive pad 12.

The second substrate 20 may include a package substrate such as a circuit board. By way of example, the second substrate 20 may include one or more dielectric layers, and one or more circuit layers. In some embodiments, the circuit layer in the second substrate 20 may include a substrate-level circuit layer (e.g., low-density circuit layer) or bumping-level circuit layer (e.g., high-density circuit layer). In some embodiments, the second substrate 20 may further include a plurality of second conductive pads 22 disposed on the dielectric layer(s). The second conductive pad 22 may be disposed in proximity to, adjacent to or embedded in and exposed by the dielectric layer, and configured to receive electronic components 26 and/or the SMD component 30. The second conductive pad 22 may be electrically connected to the circuit layer(s) of the second substrate 20. Materials of the dielectric layer, the circuit layer and the second conductive pad 22 of the second substrate 20 may be similar to that of the dielectric layer, the circuit layer and the first conductive pad 12 of the first substrate 10. In some embodiments, the second conductive pad 22 may include UBM. In some embodiments, passivation layer(s) may be disposed on the second substrate 20, and the passivation layer(s) my at least partially expose the second conductive pad 22.

The semiconductor device package 1 may further include one or more first electronic components 16 disposed on the first substrate 10, and one or more second electronic components 26 disposed on the second substrate 20. The first electronic components 16 may be disposed on the first surface 101 and/or a third surface 102 opposite to the first surface 101 of the first substrate 10. The second electronic components 26 may be disposed on the second surface 201 and/or a fourth surface 202 opposite to the second surface 201 of the second substrate 20. In some embodiments, the first electronic components 16 may include active electronic components 16A such as system on chip (SOC) component, memory component or the like, and/or passive electronic components 16B such as resistor, capacitor or inductor. The first electronic components 16 may be electrically connected to the first conductive pads 12 through conductive structures 16X such as solder bumps, solder paste or the like. The first electronic components 16 can be in electrical communication with each other through the first substrate 10. In some embodiments, the second electronic components 26 may include active electronic components 26A such as SOC component, memory component or the like, and/or passive electronic components 26B such as resistor, capacitor or inductor. The second electronic components 26 may be electrically connected to the second conductive pads 22 through conductive structures 26X such as solder bumps, solder paste or the like. The second electronic components 26 can be in electrical communication with each other through the second substrate 20. The first electronic components 16 and the second electronic components 26 can be in electrical communication with each other through the first substrate 10, the SMD component 30 and the second substrate 20.

The SMD component 30 is disposed between the first substrate 10 and the second substrate 20. The SMD component 30 includes a plurality of connection electrodes 34 electrically connecting the first substrate 10 to the second substrate 20, and the plurality of connection electrodes 34 are electrically disconnected from each other. Each of the connection electrodes 34 may be used to provide an independent electrical connection path between the first substrate 10 and the second substrate 20 in a vertical direction, while no electrical connection is formed between the connection electrodes 34 in a horizontal direction. In some embodiments, the SMD component 30 may further includes an insulating base 32 having an outer surface 32S, which is covered by the plurality of connection electrodes 34. The outer surface 32S of the insulating base 32 may define an interior volume 32V, and the connection electrodes 34 are electrically disconnected from each other inside the interior volume 32V, and outside the interior volume 32V. In some embodiments, the connection electrodes 34 are electrically uncoupled from each other inside the interior volume 32V when an alternating current voltage is applied across the connection electrodes 34. In some embodiments, adjacent connection electrodes 34 may be parasitically coupled outside the interior volume 32V of the insulating base 32. The SMD component 30 is configured as a standoff component for maintain a gap between the first substrate 10 and the second substrate 20. The SMD component 30 is also configured as an interconnection component for interconnecting the first substrate 10 and the second substrate 20. In some embodiments, the SMD component 30 includes two connection electrodes 34 disposed on opposite sides of the insulating base 32 as shown in FIG. 1A and FIG. 1B, and the SMD component 30 may be configured as a two-terminal interconnection component. The number of the connection electrodes 34 can be modified to implement multi-terminal interconnection criterion. Different SMD components 30 may have different numbers of connection electrodes 34 to meet the interconnection criteria in different locations of the semiconductor device package 1. In FIG. 1, two SMD components 30 are drawn for example, but the number of the SMD components 30 can be modified based on the I/O connections between the first substrate 10 and the second substrate 20.

In some embodiments, the outer surface 32S of the insulating base 32 may include a first outer surface 32S1 facing the first substrate 10, a second outer surface 32S2 facing the second substrate 20, and an outer edge 32S3 connected to the first outer surface 32S1 and the second outer surface 32S2. Each connection electrode 34 may include a main portion 340 disposed on the outer edge 32S3 of the insulating base 32, a first extension portion 341 extending to the first outer surface 32S1 of the insulating base 32, and a second extension portion 342 extending to the second outer surface 32S2 of the insulating base 32.

The semiconductor device package 1 may further include a plurality of first solder materials 42 disposed on the first substrate 10, and a plurality of second solder materials 44 disposed on the second substrate 20. Each first solder material 42 may partially cover the respective connection electrodes 34, e.g., a portion of the main portion 340 and the first extension portion 341 of the respective connection electrode 34, and helps to bond the respective connection electrode 34 to the respective first conductive pad 12. Each second solder material 44 may partially cover the respective connection electrodes 34, e.g., a portion of the main portion 340 and the second extension portion 342 of the respective connection electrode 34, and helps to bond the respective connection electrode 34 to the respective second conductive pad 22. In some embodiments, an outer edge 12E of each first conductive pad 12 protrudes out a respective outer edge 34E of the connection electrode 34, and an outer edge 22E of each second conductive pad 22 protrudes out the respective outer edge 34E of the connection electrode 34. In some embodiments, the first solder materials 42 and the second solder materials 44 are apart from each other, such that the first solder materials 42 and the second solder materials 44 are not merged. Accordingly, the amounts of the first solder materials 42 and the second solder material 44 can be accurately controlled, which minimizes the risks of open-circuitry and short-circuitry, increases the tolerance to warpage, and improves yield and reliability. The material of the first solder material 42 and the second solder material 44 may include for example, but is not limited to, tin (Sn), lead (Pb), silver (Ag), copper (Cu) or an alloy thereof. In some embodiments, the material of the first solder material 42 and the second solder material 44 may include the same material, or different materials.

The SMD component 30 may be a pre-formed component, which is formed prior to being bonded to the first substrate 10 and/or the second substrate 20. In some embodiments, the SMD components 30 may include discrete components, and disposed between the first electronic components 16, between the second electronic components 26, or between the first electronic component 16 and the second electronic component 26. The SMD component 30 may include a dummy passive component in which the passive component function is disabled. By way of examples, the SMD component 30 may include a dummy resistor without resistor function or with ignorable resistor function. The dummy resistor may have two or more connection electrodes 34 electrically disconnected from each other and disposed on the insulating base 32, and no resistive wire such as resistive film is disposed in the insulating base 32. In some embodiments, the SMD component 30 may include a dummy capacitor without capacitor function or with ignorable capacitor function. The dummy capacitor may have two or more connection electrodes 34 electrically disconnected from each other and disposed on the insulating base 32, and the dielectric constant of the insulating base 32, the overlapping area of the connection electrodes 34 and the distance between the connection electrodes 34 are such selected that the capacitance can be ignored. In some embodiments, the SMD component 30 may include a dummy inductor without inductor function or with ignorable inductor function. The dummy capacitor may have two or more connection electrodes 34 electrically disconnected from each other and disposed on the insulating base 32, and no coil is disposed in the insulating base 32.

The semiconductor device package 1 may further include an encapsulation layer 50 disposed between the first substrate 10 and the second substrate 20, and encapsulating the SMD component 30, the first electronic components 16 and the second electronic components 26. The SMD components 30 may include discrete components, and disposed separately between the first electronic components 16, between the second electronic components 26, or between the first electronic component 16 and the second electronic component 26. Therefore, the SMD components 30 do not block the mold flow of the molding material of the encapsulation layer 50, and the molding material can smoothly flow into the space between the first substrate 10 and the second substrate 20 from any directions parallel to the first surface 101 and the second surface 201 such as a first direction D1 and a second direction D2.

In some embodiments, a portion of the first electronic components 16 and the second electronic components 26 are further disposed on the third surface 102 of the first substrate 10 and/or the fourth surface 202 of the second substrate 20, and an encapsulation layer 52 and/or an encapsulation layer 54 can be disposed on the third surface 102 of the first substrate 10 and the fourth surface 202 of the second substrate 20. The material(s) of the encapsulation layers 50, 52 and 54 may include organic molding compound such as epoxy resin or the like. The material(s) of the encapsulation layers 50, 52 and 54 may be the same or different. In some embodiments, fillers such as silicon oxide fillers may be individually added in the encapsulation layers 50, 52 and 54. In some embodiments, the SMD components 30 are discrete components, and the SMD components 30 may be arranged separately. Accordingly, mold flow during formation of the encapsulation layer 50 is not blocked by the SMD components 30 and the utilization rate of substrate area can be increased.

In some embodiments, the semiconductor device package 1 may further include electrical conductors 18 such as solder balls disposed on the third surface 102 of the first substrate 10 and configured to electrically connect the first substrate 10 to another electronic device such as a printed circuit board (PCB).

The SMD component 30 is configured as both a standoff component for maintain a gap between the first substrate 10 and the second substrate 20, and a multi-terminal interconnection component for interconnecting the first substrate 10 and the second substrate 20. Accordingly, the dimension of the semiconductor device package 1 can be reduced. Compared to a semiconductor interconnection interposer, the manufacturing cost and package size of the SMD component 30 can be reduced. Also, the SMD component 30 can be formed by surface mount technique (SMT) such as pick and place operation. In addition, the SMD components 30 may include discrete components, and disposed separately between the first electronic components 16, between the second electronic components 26, or between the first electronic component 16 and the second electronic component 26. Therefore, the SMD components 30 do not block the mold flow of the molding material of the encapsulation layer 50, and the molding material can smoothly flow into the space between the first substrate 10 and the second substrate 20 from any directions parallel to the first surface 101 and the second surface 201 such as a first direction D1 and a second direction D2.

The semiconductor device packages of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 2A:
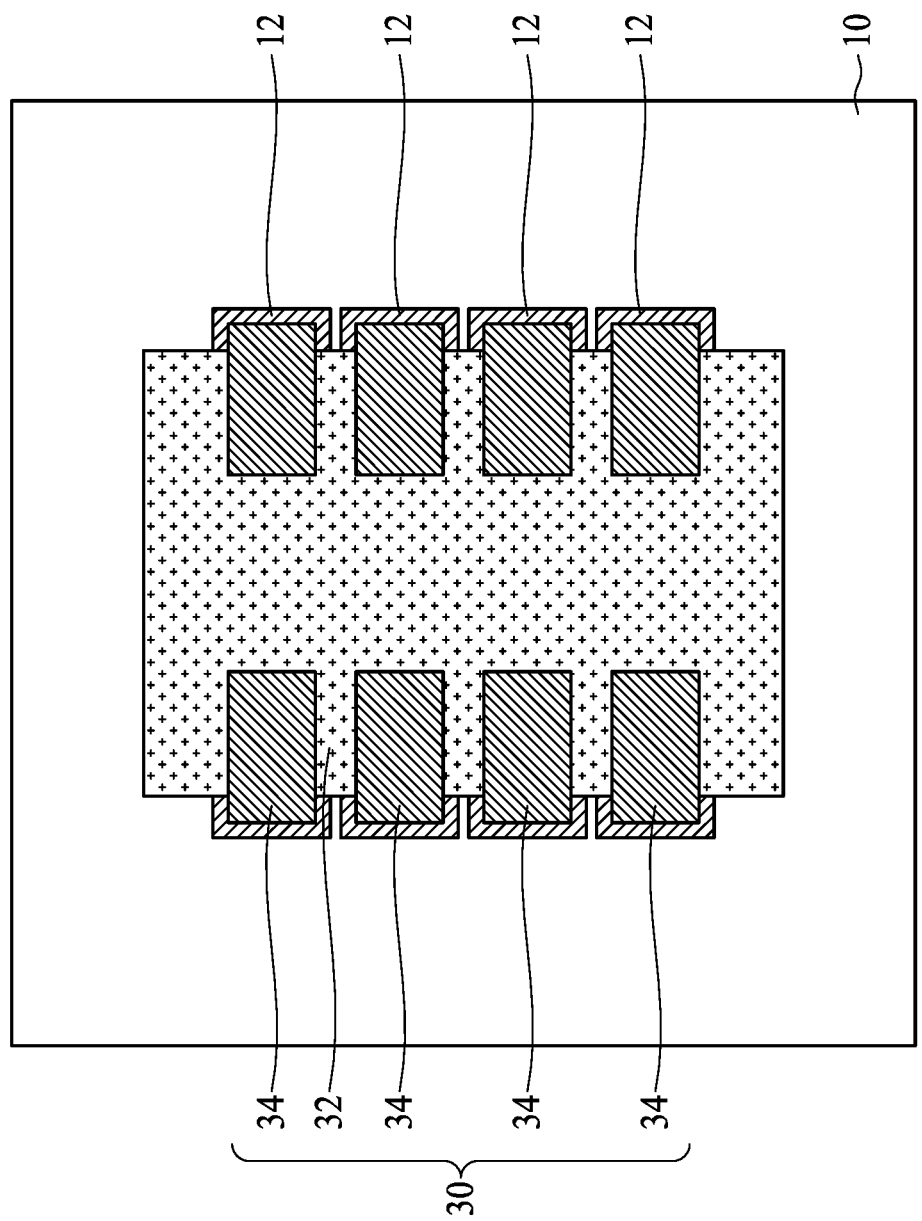
FIG. 2A is a top view of a semiconductor device package in accordance with some embodiments of the present disclosure.

FIG. 2A is a top view of a semiconductor device package 2A in accordance with some embodiments of the present disclosure. As shown in FIG. 2A, the SMD component 30 of the semiconductor device package 2A includes a plurality of connection electrodes 34 disposed on two opposite sides of the insulating base 32. For example, each of the two opposite sides of the insulating base 32 is covered by two or more connection electrodes 34. The SMD component 30 of the semiconductor device package 2A provides more I/O connections between the first substrate 10 and the second substrate 20.

Figure 2B:
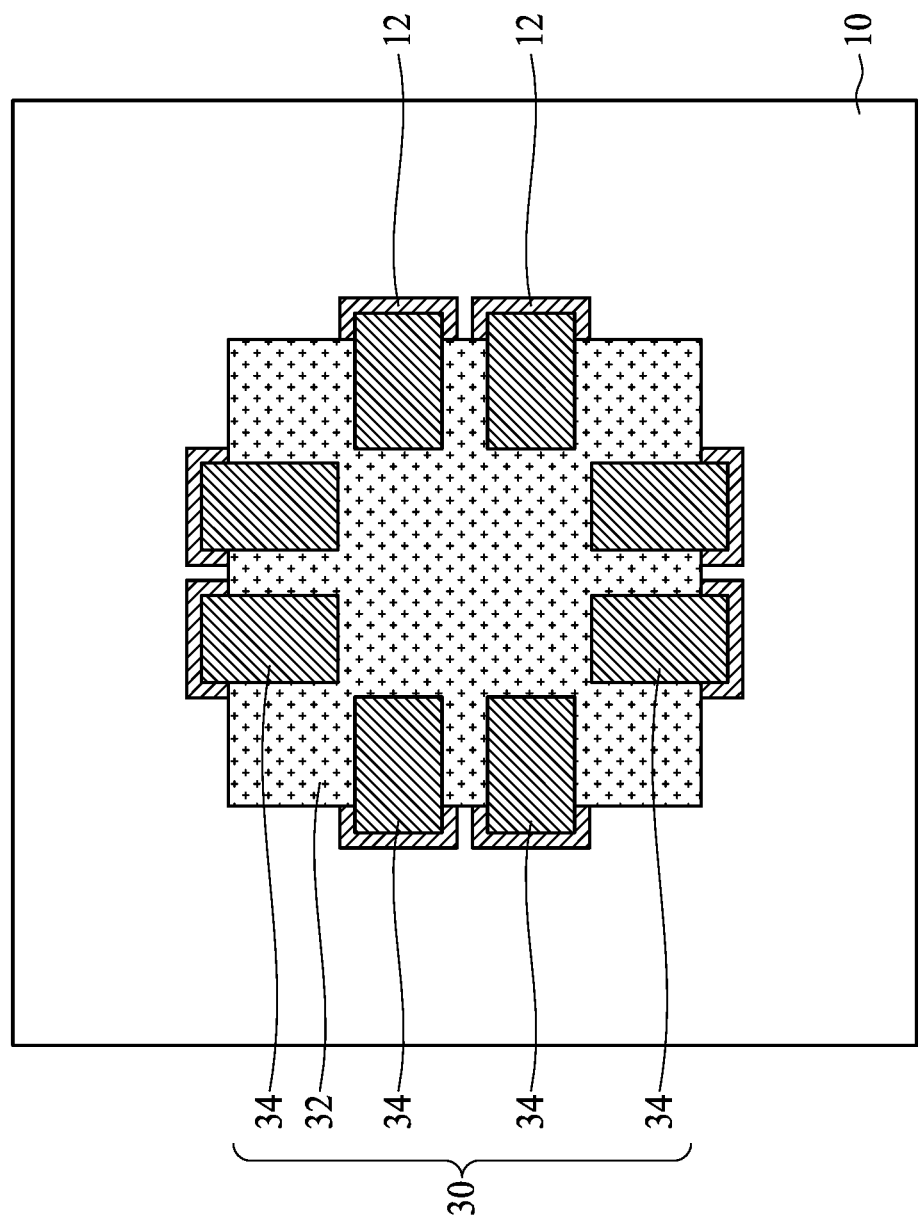
FIG. 2B is a top view of a semiconductor device package in accordance with some embodiments of the present disclosure.

FIG. 2B is a top view of a semiconductor device package 2B in accordance with some embodiments of the present disclosure. As shown in FIG. 2B, the SMD component 30 of the semiconductor device package 2B includes a plurality of connection electrodes 34 disposed on more than two sides of the insulating base 32. For example, each of the four sides of the insulating base 32 is covered by one or more connection electrodes 34. The SMD component 30 of the semiconductor device package 2B provides more I/O connections between the first substrate 10 and the second substrate 20.

Figure 3A:
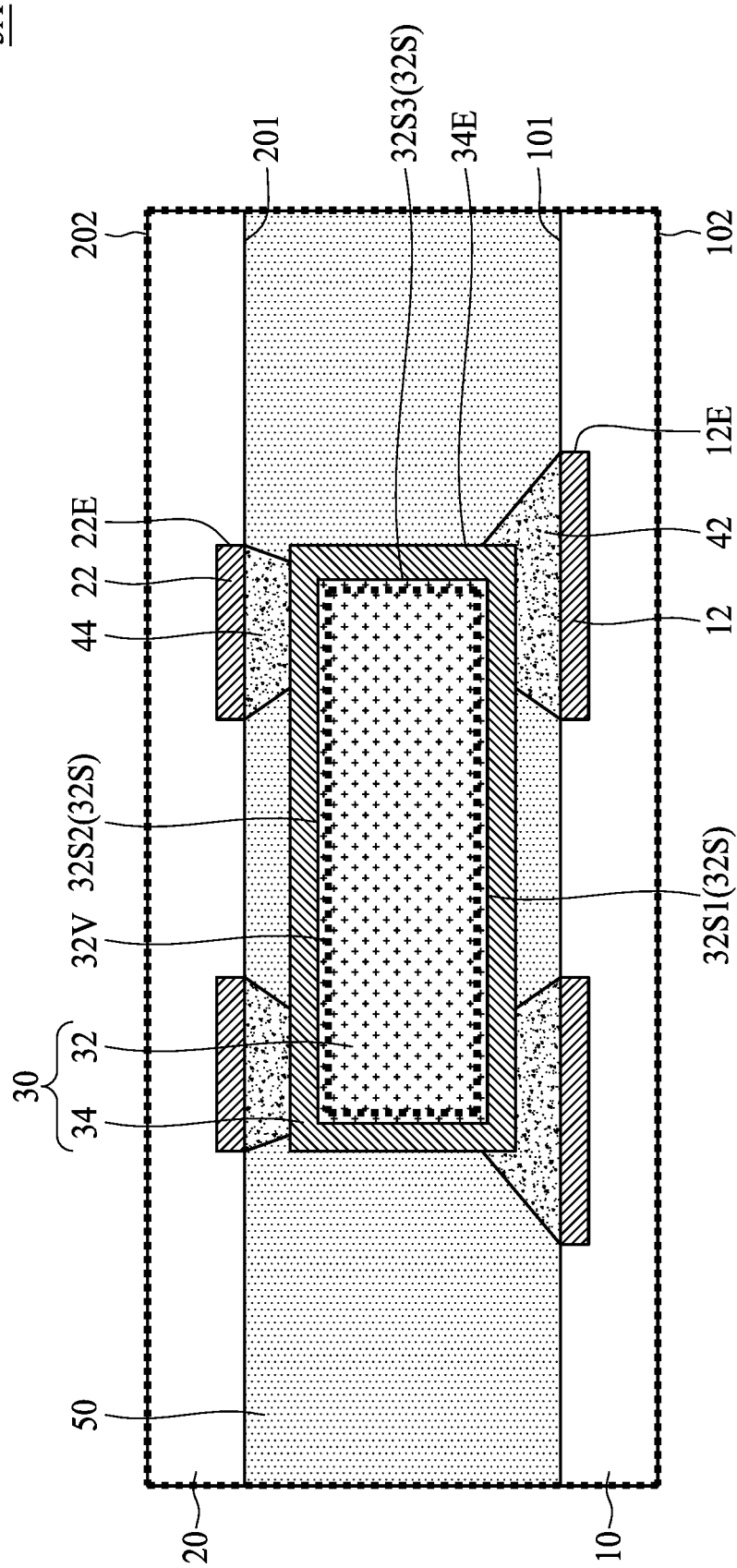
FIG. 3A is a cross-sectional view of a semiconductor device package in accordance with some embodiments of the present disclosure.

FIG. 3A is a cross-sectional view of a semiconductor device package 3A in accordance with some embodiments of the present disclosure. As shown in FIG. 3A, the SMD component 30 may include one connection electrode 34. The connection electrode 34 may be disposed on at least one side of the insulating base 32. For example, the connection electrode 34 may be disposed on two opposite sides or four sides of the insulating base 32. The number of the first conductive pad 12 and the second conductive pad 22 may be the same with or different from the number of the connection electrode 34. The outer edge 12E of the first conductive pad 12 is misaligned with a respective outer edge 22E of the second conductive pad 22. By way of example, the outer edge 12E of each first conductive pad 12 protrudes out a respective outer edge 34E of the connection electrode 34, while the outer edge 22E of the second conductive pad 22 is substantially aligned with or recessed from the respective outer edge 34E of the connection electrode 34. The asymmetrical design of the first conductive pad 12 and the second conductive pad 22 helps to accurately control the location of the first solder material 42 and the second solder material 44, and prevents the first solder material 42 from being merged with the second solder material 44. Therefore, the amount of the first solder material 42 and the amount of the second solder material 44 can be accurately controlled, and open-circuitry and short-circuitry risks can be reduced.

Figure 3B:
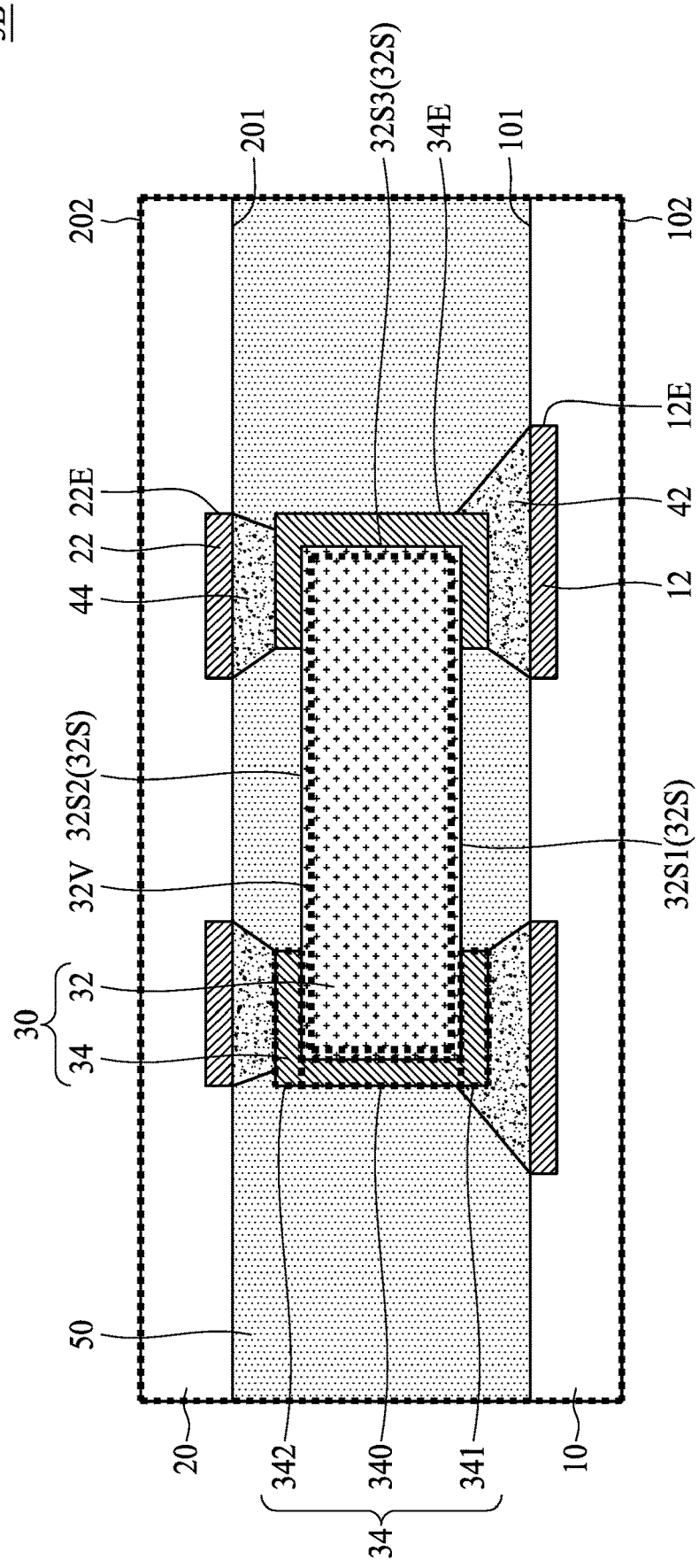
FIG. 3B is a cross-sectional view of a semiconductor device package in accordance with some embodiments of the present disclosure.

FIG. 3B is a cross-sectional view of a semiconductor device package 3B in accordance with some embodiments of the present disclosure. As shown in FIG. 3B, the outer edge 12E of each first conductive pads 12 is misaligned with a respective outer edge 22E of the second conductive pad 22. By way of example, the outer edge 12E of each first conductive pad 12 protrudes out a respective outer edge 34E of the connection electrode 34, while the outer edge 22E of the second conductive pad 22 is substantially aligned with or recessed from the respective outer edge 34E of the connection electrode 34. The asymmetrical design of the first conductive pad 12 and the second conductive pad 22 helps to accurately control the location of the first solder material 42 and the second solder material 44, and prevents the first solder material 42 from being merged with the second solder material 44. Therefore, the amount of the first solder material 42 and the amount of the second solder material 44 can be accurately controlled, and open-circuitry and short-circuitry risks can be reduced.

Figure 3C:
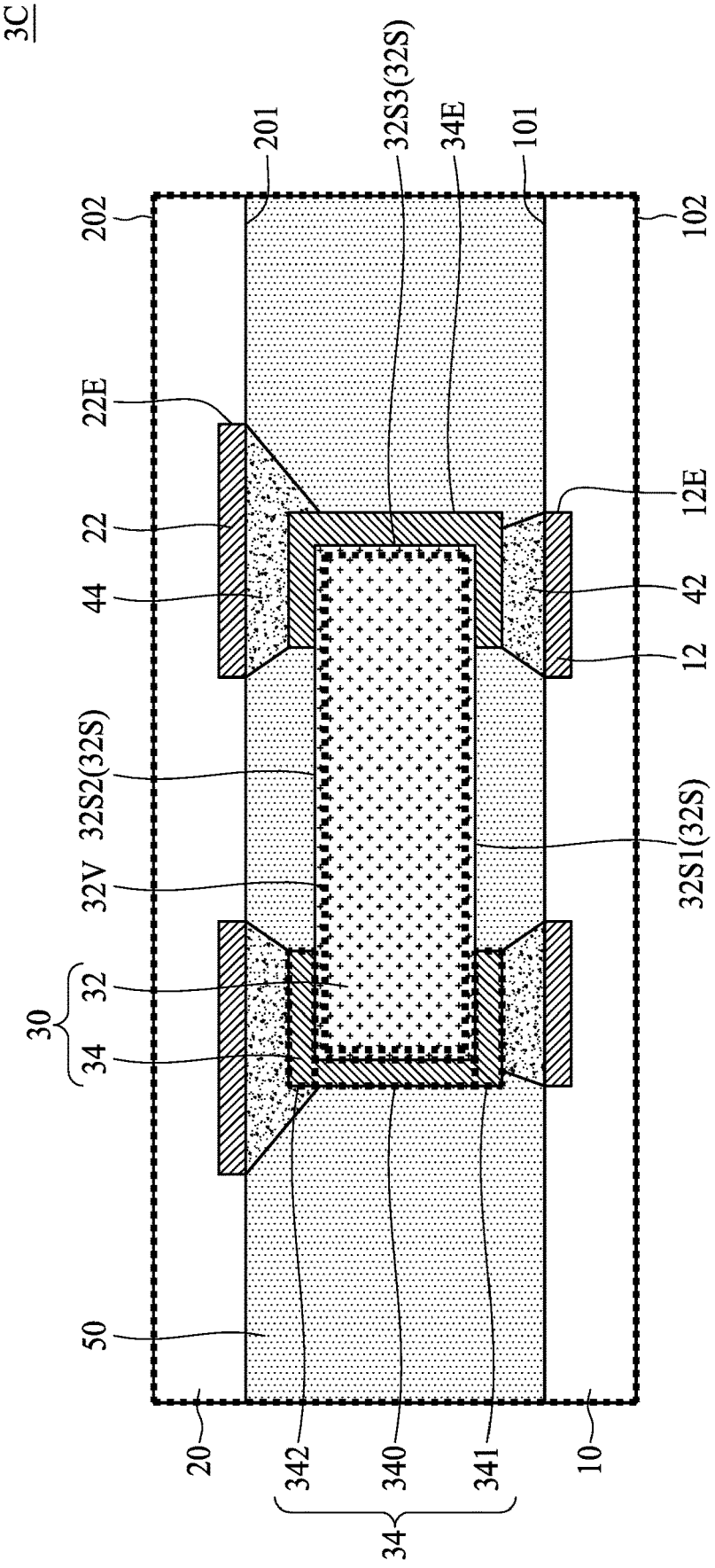
FIG. 3C is a cross-sectional view of a semiconductor device package in accordance with some embodiments of the present disclosure.

FIG. 3C is a cross-sectional view of a semiconductor device package 3C in accordance with some embodiments of the present disclosure. As shown in FIG. 3C, the outer edge 12E of each first conductive pads 12 is misaligned with a respective outer edge 22E of the second conductive pad 22. By way of example, the outer edge 12E of each first conductive pad 12 is substantially aligned with or recess from a respective outer edge 34E of the connection electrode 34, while the outer edge 22E of the second conductive pad 22 protrudes out the respective outer edge 34E of the connection electrode 34. The asymmetrical design of the first conductive pad 12 and the second conductive pad 22 helps to accurately control the location of the first solder material 42 and the second solder material 44, and prevents the first solder material 42 from being merged with the second solder material 44. Therefore, the amount of the first solder material 42 and the amount of the second solder material 44 can be accurately controlled, and open-circuitry and short-circuitry risks can be reduced.

Figure 4A:
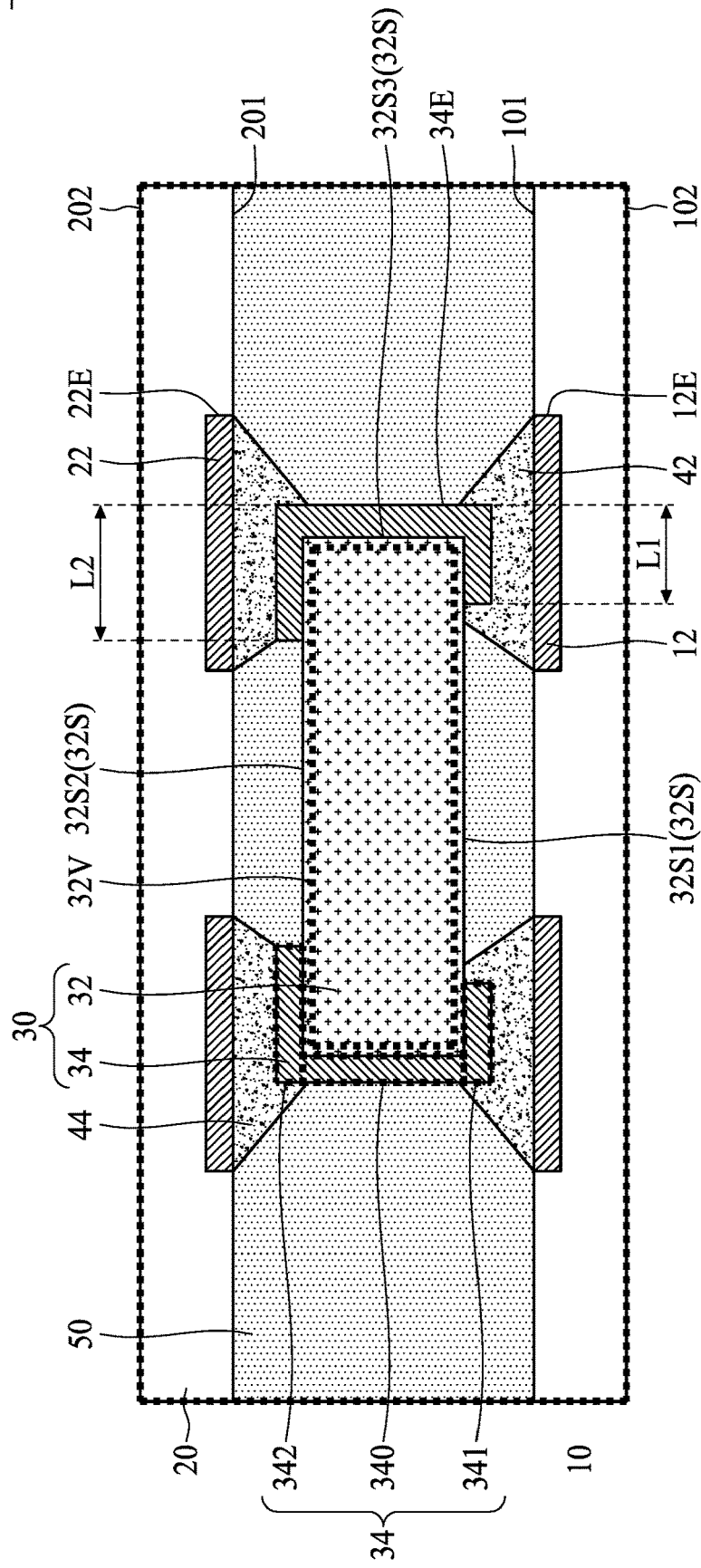
FIG. 4A is a cross-sectional view of a semiconductor device package in accordance with some embodiments of the present disclosure.

FIG. 4A is a cross-sectional view of a semiconductor device package 4A in accordance with some embodiments of the present disclosure. As shown in FIG. 4A, the length L1 of the first extension portion 341 is different from the length L2 of the second extension portion 342. By way of example, the length L1 of the first extension portion 341 is smaller than the length L2 of the second extension portion 342. The asymmetrical design of the first extension portion 341 and the second extension portion 342 helps to accurately control the location of the first solder material 42 and the second solder material 44, and prevents the first solder material 42 from being merged with the second solder material 44. Therefore, the amount of the first solder material 42 and the amount of the second solder material 44 can be accurately controlled, and open-circuitry and short-circuitry risks can be reduced.

Figure 4B:
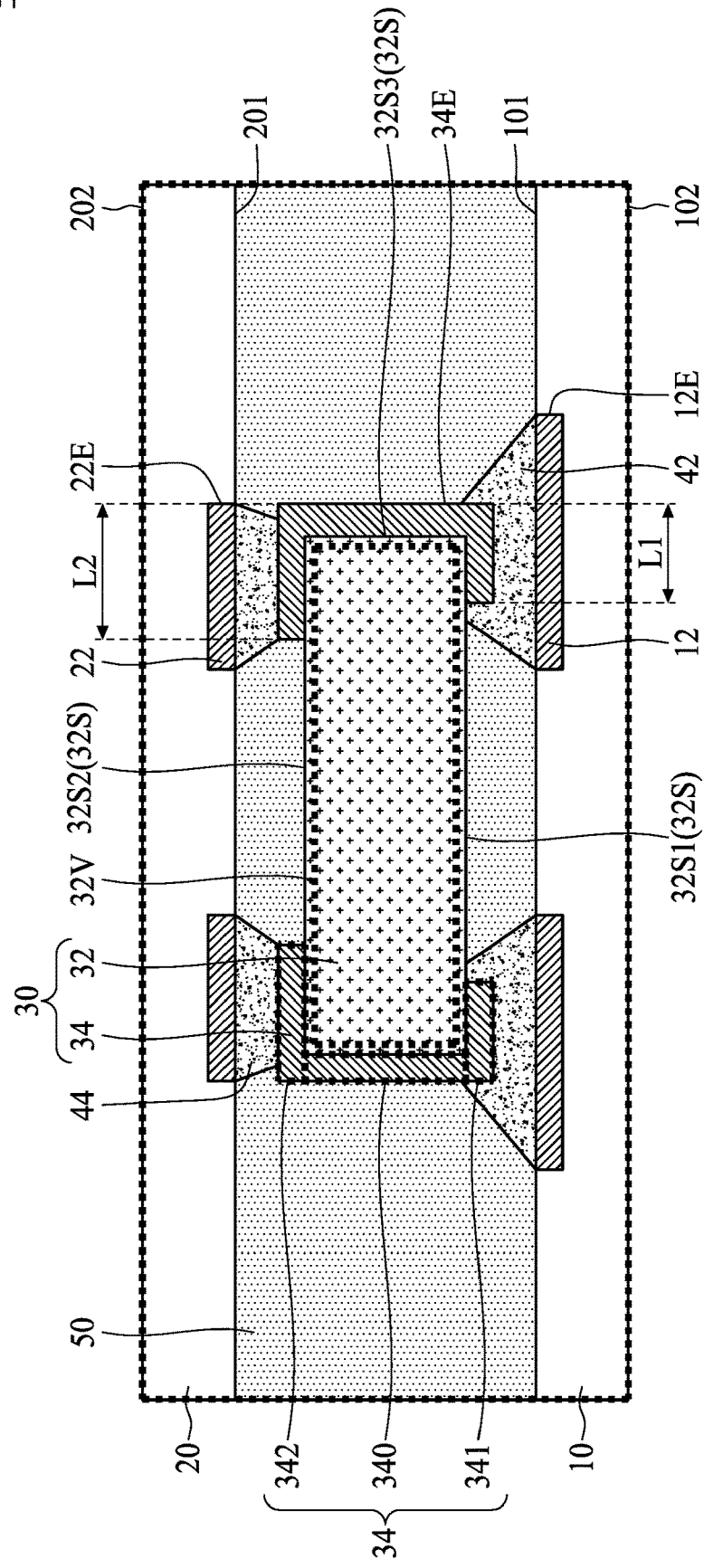
FIG. 4B is a cross-sectional view of a semiconductor device package in accordance with some embodiments of the present disclosure.

FIG. 4B is a cross-sectional view of a semiconductor device package 4B in accordance with some embodiments of the present disclosure. As shown in FIG. 4B, the outer edge 12E of each first conductive pads 12 is misaligned with a respective outer edge 22E of the second conductive pad 22. By way of example, the outer edge 12E of each first conductive pad 12 is substantially aligned with or recess from a respective outer edge 34E of the connection electrode 34, while the outer edge 22E of the second conductive pad 22 protrudes out the respective outer edge 34E of the connection electrode 34. In addition, the length L1 of the first extension portion 341 is different from the length L2 of the second extension portion 342. By way of example, the length L1 of the first extension portion 341 is smaller than the length L2 of the second extension portion 342. The asymmetrical design of the first extension portion 341 and the second extension portion 342 in combination with the asymmetrical design of the first extension portion 341 and the second extension portion 342 helps to accurately control the location of the first solder material 42 and the second solder material 44, and prevents the first solder material 42 from being merged with the second solder material 44. Therefore, the amount of the first solder material 42 and the amount of the second solder material 44 can be accurately controlled, and open-circuitry and short-circuitry risks can be reduced.

In some embodiments of the present disclosure, the semiconductor device package includes two stacked substrates, and a SMD component disposed therebetween. The SMD component is configured as a standoff component for maintain a gap between the two stacked substrates, and also configured as an interconnection component for electrically connecting the two stacked substrates and electronic components disposed on the two stacked substrates. The dimension of the semiconductor device package thus can be reduced. The SMD component can be readily formed by surface mount technique such as pick and place operation. The SMD component includes a plurality of connection electrodes electrically connecting one of the substrates to the other. Each of the connection electrodes may electrically connects a respective electrical terminal of a first substrate to a respective electrical terminal of a second substrate in a vertical direction, and the connection electrodes are electrically disconnected from each other in a horizontal direction. The SMD components may include a plurality of discrete components separately arranged, which does not impede mold flow of molding compound. Thus, the electronic components and the SMD components can be arranged to maximize utilization rate of substrate area without impeding the mold flow of the molding material. The SMD component may include a dummy passive component in which the passive component function is disabled. Accordingly, the manufacturing cost of the semiconductor device package can be reduced.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a first substrate;
   a second substrate disposed over the first substrate; and
   a surface mount device (SMD) component disposed between the first substrate and the second substrate, wherein the SMD component comprises a plurality of connection electrodes electrically connecting the first substrate to the second substrate, and the plurality of connection electrodes are electrically disconnected from each other, and wherein the connection electrodes are spaced apart from the first substrate.

2. The semiconductor device package of claim 1, wherein the SMD component further comprises an insulating base including an outer surface covered by the plurality of connection electrodes.

3. The semiconductor device package of claim 2, wherein the outer surface of the insulating base defines an interior volume, and the plurality of connection electrodes are electrically uncoupled from each other inside the interior volume when an alternating current voltage is applied across the connection electrodes.

4. The semiconductor device package of claim 1, further comprising a plurality of first solder materials disposed on the first substrate and partially covering the plurality of connection electrodes respectively, and a plurality of second solder materials disposed on the second substrate and partially covering the plurality of connection electrodes respectively.

5. The semiconductor device package of claim 4, wherein the first solder materials and the second solder materials are apart from each other.

6. The semiconductor device package of claim 1, further comprising a plurality of first conductive pads disposed between the first substrate and the plurality of connection electrodes respectively, and a plurality of second conductive pads disposed between the second substrate and the plurality of connection electrodes respectively.

7. The semiconductor device package of claim 6, wherein outer edges of the first conductive pads protrude out respective outer edges of the connection electrodes.

8. The semiconductor device package of claim 7, wherein outer edges of the second conductive pads protrude out the respective outer edges of the connection electrodes.

9. The semiconductor device package of claim 7, wherein outer edges of the second conductive pads are substantially aligned with or recessed from the respective outer edges of the connection electrodes.

10. The semiconductor device package of claim 1, wherein the SMD component comprises a dummy passive component.

11. The semiconductor device package of claim 10, wherein the dummy passive component is a passive component with disabled passive component function.

12. The semiconductor device package of claim 1, further comprising:
   an encapsulation layer disposed between the first substrate and the second substrate, and encapsulating the SMD component;
   at least one first electronic component disposed on the first substrate; and
   at least one second electronic component disposed on the second substrate, wherein the at least one first electronic component and the at least one second electronic component are electrically connected through the connection electrodes of the SMD component.

13. A semiconductor device package, comprising:
   a first substrate;
   a second substrate disposed over the first substrate;
   a first conductive pad disposed on the first substrate;
   a second conductive pad disposed on the second substrate; and
   a surface mount device (SMD) component disposed between the first substrate and the second substrate, wherein the SMD component comprises at least one connection electrode electrically connecting the first conductive pad to the second conductive pad, an outer edge of the first conductive pad protrudes out a respective outer edge of the connection electrode, and an outer edge of the second conductive pad is substantially aligned with or recessed from the respective outer edge of the connection electrode.

14. The semiconductor device package of claim 13, wherein the SMD component further comprises an insulating base including a first outer surface facing the first substrate, a second outer surface facing the second substrate, and an outer edge connected to the first outer surface and the second outer surface, and the connection electrode includes a main portion disposed on the outer edge of the insulating base, a first extension portion extending to the first outer surface of the insulating base, and a second extension portion extending to the second outer surface of the insulating base.

15. The semiconductor device package of claim 14, wherein a length of the first extension portion is different from a length of the second extension portion.

16. The semiconductor device package of claim 14, further comprising a first solder material disposed between the first conductive pad and the connection electrode, and a second solder material disposed between the second conductive pad and the connection electrode.

17. The semiconductor device package of claim 16, wherein the main portion of the connection electrode is partially covered by the first solder material, and the main portion of the connection electrode is exposed from the second solder material.

18. A semiconductor device package, comprising:
   a first substrate;

a second substrate disposed over the first substrate;
a first conductive pad disposed on the first substrate;
a second conductive pad disposed on the second substrate; and
a surface mount device (SMD) component disposed between the first substrate and the second substrate and electrically connecting the first conductive pad to the second conductive pad, wherein the SMD component comprises:
  an insulating base including a first outer surface facing the first substrate, a second outer surface facing the second substrate, and an outer edge connected to the first outer surface and the second outer surface; and
  at least one connection electrode disposed on the insulating base, the connection electrode including a main portion disposed on the outer edge of the insulating base, a first extension portion extending to the first outer surface of the insulating base, and a second extension portion extending to the second outer surface of the insulating base, wherein a length of the first extension portion of the connection electrode is different from a length of the second extension portion of the connection electrode.

19. The semiconductor device package of claim 18, further comprising a first solder material disposed between the first conductive pad and the first extension portion, and a second solder material disposed between the second conductive pad and the second extension portion, wherein the first solder material is apart from the second solder material.

20. The semiconductor device package of claim 19, wherein the main portion of the connection electrode is partially covered by the first solder material, and the main portion of the connection electrode is exposed from the second solder material.

21. The semiconductor device package of claim 2, wherein the outer surface of the insulating base faces the first substrate, the insulating base further includes an outer edge connected to the outer surface, and wherein the connection electrode includes a main portion disposed on the outer edge of the insulating base, and a first extension portion extending to the outer surface of the insulating base.

22. The semiconductor device package of claim 4, wherein the SMD component further comprises an insulating base including an outer edge; and the first solder materials cover the outer edge of the insulating base.

23. The semiconductor device package of claim 1, further comprising an encapsulation layer in contact with the first substrate, the second substrate and the SMD component.

24. The semiconductor device package of claim 23, wherein the encapsulation layer is further disposed in a gap between the first substrate and the SMD component, and in another gap between the second substrate and the SMD component.

25. The semiconductor device package of claim 23, further comprising:
  a first electronic component disposed on the first substrate; and
  a second electronic component disposed on the second substrate, wherein the first electronic component and the second electronic component are located between the first substrate and the second substrate, and encapsulated by the encapsulation layer.

* * * * *